United States Patent
Liao et al.

(10) Patent No.: US 8,368,458 B2
(45) Date of Patent: Feb. 5, 2013

(54) IMPEDANCE TUNING APPARATUS (75) Inventors: Ting-Ko Liao, Hsin-Chu (TW); Tsu-Chun Liu, Hsin-Chu (TW)

(73) Assignee: IC Plus Corp., Hsin-Chu (TW)

( * ) Notice: Subject to any disclaimer, the term of this patent is extended or adjusted under 35 U.S.C. 154(b) by 120 days.

(21) Appl. No.: 13/038,387

(22) Filed: Mar. 2, 2011

(65) Prior Publication Data

US 2012/0154027 A1 Jun. 21, 2012

(30) Foreign Application Priority Data

Dec. 20, 2010 (TW) ................................ 99144831 A (51) Int. Cl.
*G05F 1/10* (2006.01)
*G05F 3/02* (2006.01)
(52) U.S. Cl. ......... 327/540; 327/538; 327/539; 327/315
(58) Field of Classification Search .................. 327/530, 327/538–543, 546; 323/312–317
See application file for complete search history.

(56) References Cited

U.S. PATENT DOCUMENTS

| | | | | |
|---|---|---|---|---|
| 6,008,632 | A * | 12/1999 | Sasaki | 323/313 |
| 6,949,971 | B2 * | 9/2005 | Jang | 327/541 |
| 7,218,168 | B1 * | 5/2007 | Rahman | 327/540 |
| 7,633,347 | B2 * | 12/2009 | Tan et al. | 331/16 |
| 8,278,996 | B2 * | 10/2012 | Miki et al. | 327/541 |
| 2006/0232326 | A1 * | 10/2006 | Seitz et al. | 327/539 |
| 2008/0218221 | A1 * | 9/2008 | Yen et al. | 327/103 |
| 2008/0218277 | A1 * | 9/2008 | Tan et al. | 331/17 |
| 2009/0080267 | A1 * | 3/2009 | Bedeschi et al. | 365/189.09 |
| 2009/0206886 | A1 | 8/2009 | Chang et al. | |

* cited by examiner

*Primary Examiner* — Lincoln Donovan
*Assistant Examiner* — Brandon S Cole
(74) *Attorney, Agent, or Firm* — Jianq Chyun IP Office (57) ABSTRACT

An impendence tuning apparatus is disclosed. The impendence tuning apparatus includes an operation amplifier, a reference resistor, a tuned resistor, a switching module, a current generator, a current detector and a controller. A first input terminal of the operation amplifier receives a basic voltage and the second terminal of the operation amplifier coupled to a first end. The switching module receives a control and coupled the first end to the tuned resistor or the reference resistor accordingly for generating a tuned current or a reference current separately. The current generator receives and mirrors the reference current or the tuned current to generate a first current and a second current. The current detector receives the first and the second currents and outputs current values the first and the second currents to the controller. The controller tunes an impendence of the tuned resistor according to the first and the second currents.

16 Claims, 8 Drawing Sheets

FIG. 7

IMPEDANCE TUNING APPARATUS

CROSS-REFERENCE TO RELATED APPLICATION

This application claims the priority benefit of Taiwan application serial no. 99144831, filed Dec. 20, 2010. The entirety of the above-mentioned patent application is hereby incorporated by reference herein and made a part of this specification.

BACKGROUND OF THE INVENTION

1. Field of the Invention

The present invention generally relates to an impedance tuning apparatus.

2. Description of Related Art

Figure 1:
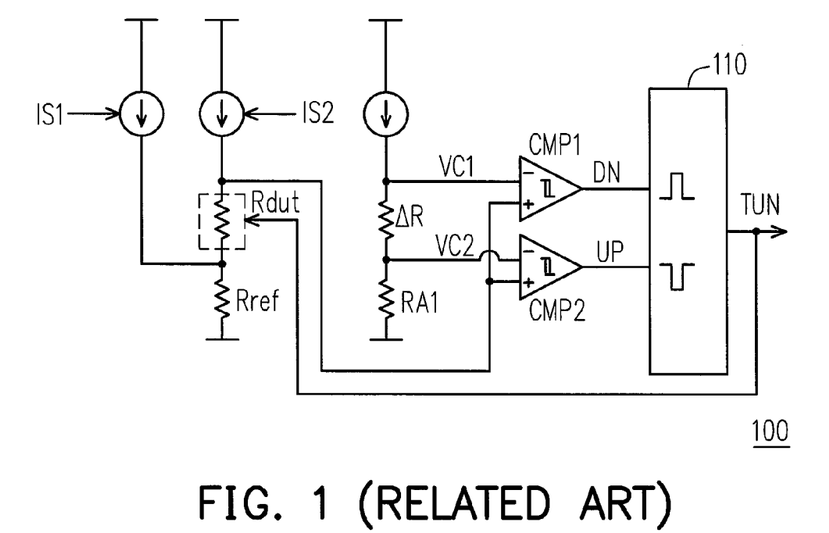
FIG. 1 is a circuit diagram of a conventional impedance tuning apparatus 100.

Referring to FIG. 1, a circuit diagram of a conventional impedance tuning apparatus 100 is shown. In the impedance tuning apparatus 100, a tuned resistor Rdut and a reference resistor Rref are serially connected with each other, and are respectively coupled to current sources IS1 and IS2. Voltage drops generated by currents flowing through the tuned resistor Rdut and the reference resistor Rref via the current sources IS1 and IS2 are simultaneously transmitted to comparators CMP1 and CMP2 to be respectively compared with reference voltages VC1 and VC2. A controller 110 generates a tuning signal TUN according to comparison results DN and UP of the comparators CMP1 and CMP2, so as to tune a resistance value of the tuned resistor Rdut. The reference voltages VC1 and VC2 are respectively generated by a current provided by a current source IS3 flowing through reference resistors ΔR and RA1.

In the impedance tuning apparatus 100 in FIG. 1, both the comparators CMP1 and CMP2 are constructed by using an operation amplifier. However, the comparison results of the comparators CMP1 and CMP2 are distorted because of the property of input voltage offset of the operation amplifier. In addition, errors of the reference resistors ΔR and RA1 for generating the reference voltages VC1 and VC2 also affect the accuracy of the comparison results of the comparators CMP1 and CMP2. The errors generated by the above factors will be more serious, especially when the impedance tuning apparatus 100 is in the form of an Integrated Circuit (IC), and an impedance tuning result of the tuned resistor Rdut is greatly degraded.

SUMMARY OF THE INVENTION

Accordingly, the present invention is directed to an impedance tuning apparatus, for effectively tuning an impedance value provided by a tuned resistor.

The present invention is further directed to an impedance tuning apparatus, for effectively tuning an impedance value provided by a plurality of tuned resistors.

The present invention provides an impedance tuning apparatus, which includes an operation amplifier, a reference resistor, a tuned resistor, a switching module, a current generator, a current detector, and a controller. The operation amplifier has a first input terminal, a second input terminal, and an output terminal. The first input terminal receives a basic voltage, and the second input terminal is coupled to a first endpoint. A terminal of the reference resistor is coupled to a reference voltage, and a terminal of the tuned resistor is coupled to the reference voltage. The switching module receives a control signal, and couples the first endpoint to the other terminal of the tuned resistor or the reference resistor according to the control signal for generating a tuned current or a reference current respectively. The current generator is coupled to the switching module, and receives and mirrors the reference current or the tuned current to generate a first current or a second current respectively. The current detector receives the first current and the second current, and outputs current values of the first and the second currents. The controller is coupled to the current detector and the tuned resistor, receives the current values of the first and the second currents, and tunes a resistance value of the tuned resistor according to the current values of the first and the second currents.

The present invention further provides an impedance tuning apparatus, which includes an operation amplifier, a reference resistor, a plurality of tuned resistors, a switching module, a current generator, a current detector, and a controller. The operation amplifier has a first input terminal, a second input terminal, and an output terminal. The first input terminal receives a basic voltage, and the second input terminal is coupled to a first endpoint. A terminal of the reference resistor is coupled to a reference voltage, and a terminal of each of the plurality of tuned resistors is commonly coupled to the reference voltage. The switching module receives the control signal, and couples the first endpoint to the other terminal of one of the tuned resistors or the other terminal of the reference resistor according to the control signal for generating a tuned current or a reference current respectively. The current generator is coupled to the switching module, and receives and mirrors the reference current or the tuned current to generate a first current or a second current respectively. The current detector receives the first current and the second currents, and outputs current values of the first and the second currents. The controller is coupled to the current detector and the tuned resistors, receives the current values of the first and the second currents, and tunes a resistance value of the tuned resistors according to the current values of the first and the second currents.

Based on the above, in the impedance tuning apparatus of the present invention, the switching module couples the first endpoint to the other terminal of the tuned resistor or the reference resistor according to the control signal, and the first endpoint enables a terminal of the reference resistor and the tuned resistors to be connected to the same voltage value for generating the reference current or the tuned current respectively. Therefore, the problem caused due to an input bias of the operation amplifier does not exist. Further, the impedance tuning apparatus of the present invention does not have any voltage dividing circuit, and thus the distortion caused due to an inaccurate resistance value may be avoided.

In order to make the aforementioned features and advantages of the present invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers are used in the drawings and the description to refer to the same or like parts.

Figure 2:
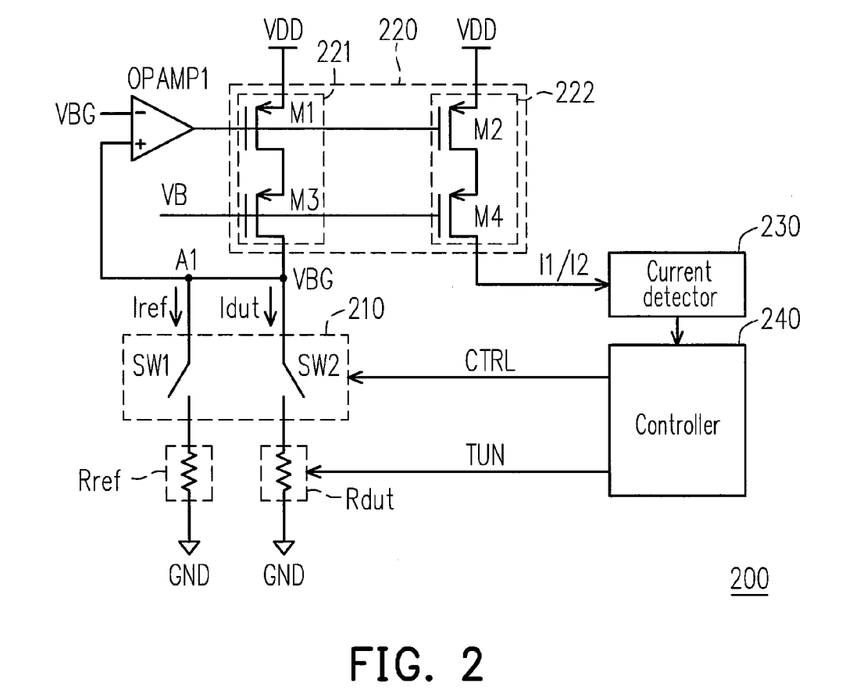
FIG. 2 is a schematic view of an impedance tuning apparatus 200 according to a first embodiment of the present invention.

Referring to FIG. 2, a schematic view of an impedance tuning apparatus 200 according to a first embodiment of the present invention is shown. The impedance tuning apparatus 200 includes an operation amplifier OPAMP1, a reference resistor Rref, a tuned resistor Rdut, a switching module 210, a current generator 220, a current detector 230, and a controller 240.

An input terminal of the operation amplifier OPAMP1 receives a basic voltage VBG, the other input terminal of the operation amplifier OPAMP1 is coupled to an endpoint A1, and an output terminal of the operation amplifier OPAMP1 is coupled to the current generator 220. A terminal of the reference resistor Rref and a terminal of the tuned resistor Rdut are commonly coupled to a grounding voltage GND, which is used as a reference voltage in this embodiment. The other terminal of the reference resistor Rref and the other terminal of the tuned resistor Rdut are coupled to the switching module 210. The switching module 210 is serially connected between the endpoint A1 and the reference resistor Rref and the tuned resistor Rdut. The switching module 210 receives a control signal CTRL, and couples the endpoint A1 to the tuned resistor Rdut or the reference resistor Rref according to the control signal CTRL. With a voltage value of the endpoint A1, a tuned current Idut is generated on the tuned resistor Rdut when the endpoint A1 is effectively coupled to the tuned resistor Rdut, and a reference current Iref is generated on the reference resistor Rref when the endpoint A1 is effectively coupled to the reference resistor Rref.

It should be noted herein that the endpoint A1 only can be coupled to one of the tuned resistor Rdut and the reference resistor Rref at a time point. That is to say, the tuned current Idut and the reference current Iref cannot be generated at the same time.

The current generator 220 is coupled to the switching module 210. The current generator 220 receives the tuned current Idut or the reference current Iref, and generates a first current or a second current (I1 or I2) respectively by mirroring the tuned current Idut or the reference current Iref. Since the tuned current Idut and the reference current Iref are respectively generated at different time points, the first current I1 and the second current I2 respectively generated by mirroring the tuned current Idut and the reference current Iref are also generated at different time points.

The current detector 230 is coupled to the current generator 220, respectively receives the first current I1 and the second current I2 at different time points, and outputs current values of the first and the second currents I1 and I2. Herein, the current detector 230 receives the first and the second currents I1 and I2 of an analog signal, digitizes the current values of the first and the second currents I1 and I2, and transmits the current values to the controller 240 in a digital (a plurality of bits) manner. In simple words, the current detector 230 may be an analog-to-digital converter.

The controller 240 is coupled to the current detector 230, so as to receive the current values of the first and the second currents I1 and I2. The controller 240 performs calculation according to the current values of the first and the second currents I1 and I2, acquires a difference between the tuned resistor Rdut and the reference resistor Rref, and transmits a tuning signal TUN according to the difference to tune a resistance value of the tuned resistor Rdut (that is, an impedance provided by the tuned resistor Rdut).

This embodiment will be described hereinafter with a practical example. First, the switching module 210 couples the endpoint A1 to the reference resistor Rref according to the control signal CTRL generated by the controller 240 for generating the reference current Tref on the reference resistor Rref, in which a voltage on the endpoint A1 is equal to the basic voltage VBG. The current generator 220 receives and mirrors the reference current Tref to generate the second current I2, and transmits the second current I2 to the current detector 230. After receiving the second current I2, the current detector 230 transmits the current value of the second current I2 to the controller 240 for temporary storage. Then, the switching module 210 re-couples the endpoint A1 to the tuned resistor Rdut according to the control signal CTRL generated by the controller 240 for generating the tuned current Idut. The current generator 220 receives and mirrors the tuned current Idut to generate the first current I1, and transmits the first current I1 to the current detector 230. After receiving the first current I1, the current detector 230 transmits the current value of the first current I1 to the controller 240.

If the current generator 220 respectively generates the first current I1 and the second current I2 by minoring the tuned current Idut and the reference current Iref in a ratio of 1:1, the controller 240 can equivalently acquire a difference between the resistance values of the tuned resistor Rdut and the reference resistor Rref only by calculating a difference between the tuned current Idut and the reference current Iref. In other words, if the controller 240 tunes the resistance value of the tuned resistor Rdut through the generated tuning signal TUN so as to make the tuned current Idut equal to the reference current Iref, it indicates that the resistance values of the tuned resistor Rdut and the reference resistor Rref are equal at this time.

In this embodiment, the current generator 220 includes a current receiving channel 221 and a current output channel 222. The current receiving channel 221 is coupled to the endpoint A1, and is used to receive the tuned current Idut or the reference current Iref. The current output channel 222 is coupled to the current receiving channel 221, so as to mirror the tuned current Idut or the reference current Iref to generate the first current I1 or the second current I2 respectively.

The current receiving channel 221 is constructed by transistors M1 and M3. A first terminal of the transistor M1 receives an operating voltage VDD, and a control terminal of the transistor M1 is coupled to the output terminal of the operation amplifier OPAMP1. A first terminal of the transistor M3 is coupled to a second terminal of the transistor M1, a control terminal of the transistor M3 is coupled to a bias voltage VB, and a second terminal of the transistor M3 is coupled to the endpoint A1, so as to receive the tuned current Idut or the reference current Iref. The current output channel 222 is constructed by transistors M2 and M4. A first terminal of the transistor M2 receives the operating voltage VDD, and a control terminal of the transistor M2 is coupled to the output terminal of the operation amplifier OPAMP1. A first terminal of the transistor M4 is coupled to a second terminal of the transistor M2, a control terminal of the transistor M4 is coupled to the bias voltage VB, and a second terminal of the transistor M4 is coupled to the current detector 230, so as to transmit the first current I1 or the second current I2.

The switching module 210 includes switches SW1 and SW2. The switch SW1 is serially connected between the endpoint A1 and the reference resistor Rref, and the switch SW2 is serially connected between the endpoint A1 and the tuned resistor Rdut. The switches SW1 and SW2 are controlled by the control signal CTRL to be turned on or off, and the switches SW1 and SW2 are not turned on at the same time. That is to say, when the switch SW1 is turned on, the switch SW2 is turned off, and on the contrary, when the switch SW2 is turned on, the switch SW1 is turned off.

Figure 3:
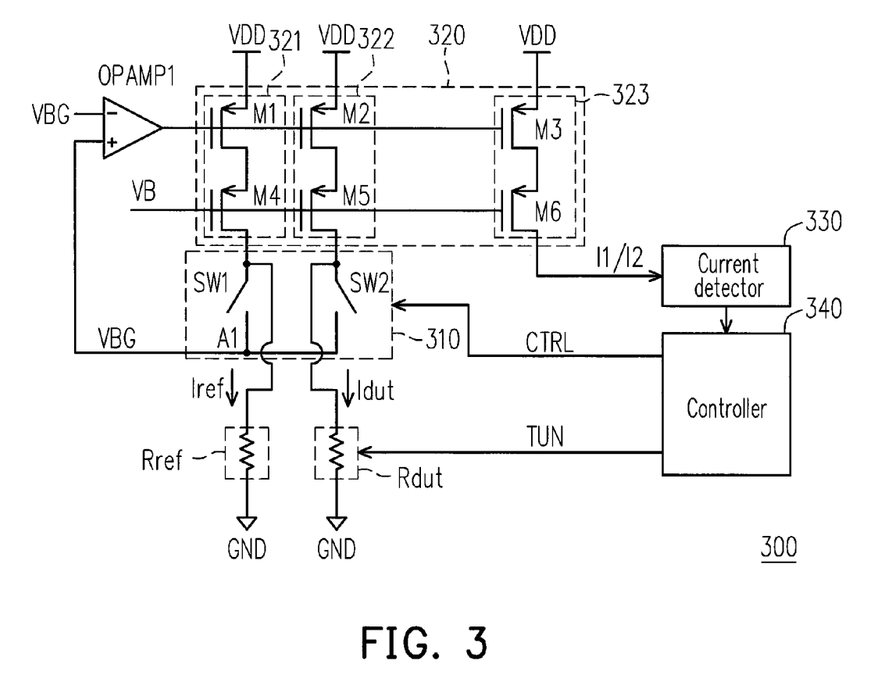
FIG. 3 is a schematic view of an impedance tuning apparatus 300 according to a second embodiment of the present invention.

Then, referring to FIG. 3, a schematic view of an impedance tuning apparatus 300 according to a second embodiment of the present invention is shown. The impedance tuning apparatus 300 includes an operation amplifier OPAMP1, a reference resistor Rref, a tuned resistor Rdut, a switching module 310, a current generator 320, a current detector 330, and a controller 340. As different from the first embodiment, the current generator 320 includes two current receiving channels 321 and 332, and in addition, the current generator 320 further includes a current output channel 323. The current receiving channel 321 is connected to the reference resistor Rref, and is used to receive a reference current Iref generated on the reference resistor Rref. In addition, the current receiving channel 322 is connected to the tuned resistor Rdut, and is used to receive a tuned current Idut generated on the tuned resistor Rdut.

The current receiving channel 321 includes transistors M1 and M4. A first terminal of the transistor M1 receives an operating voltage VDD, and a control terminal of the transistor M1 is coupled to an output terminal of the operation amplifier OPAMP1. A first terminal of the transistor M4 is coupled to a second terminal of the transistor M1, a control terminal of the transistor M4 is coupled to a bias voltage VB, and a second terminal of the transistor M4 is coupled to the switching module 310 and the reference resistor Rref. The current receiving channel 322 includes transistors M2 and M5. A first terminal of the transistor M2 receives the operating voltage VDD, and a control terminal of the transistor M2 is coupled to the output terminal of the operation amplifier OPAMP1. A first terminal of the transistor M5 is coupled to a second terminal of the transistor M2, a control terminal of the transistor M5 is coupled to the bias voltage VB, and a second terminal of the transistor M5 is coupled to the switching module 310 and the tuned resistor Rdut.

In addition, the current output channel 323 includes transistors M3 and M6. A first terminal of the transistor M3 receives the operating voltage VDD, a control terminal of the transistor M3 is coupled to the output terminal of the operation amplifier OPAMP1. A first terminal of the transistor M6 is coupled to a second terminal of the transistor M3, a control terminal of the transistor M6 is coupled to the bias voltage VB, and a second terminal of the transistor M6 generates a first current I1 or a second current I2.

The switching module 310 in this embodiment includes switches SW1 and SW2. The switch SW1 is serially connected between the endpoint A1 and the second terminal of the transistor M4, and the switch SW2 is serially connected between the endpoint A1 and the second terminal of the transistor M5. As same with the previous embodiment, the switches SW1 and SW2 are controlled by a control signal CTRL, and are not turned on at the same time.

Figure 4A:
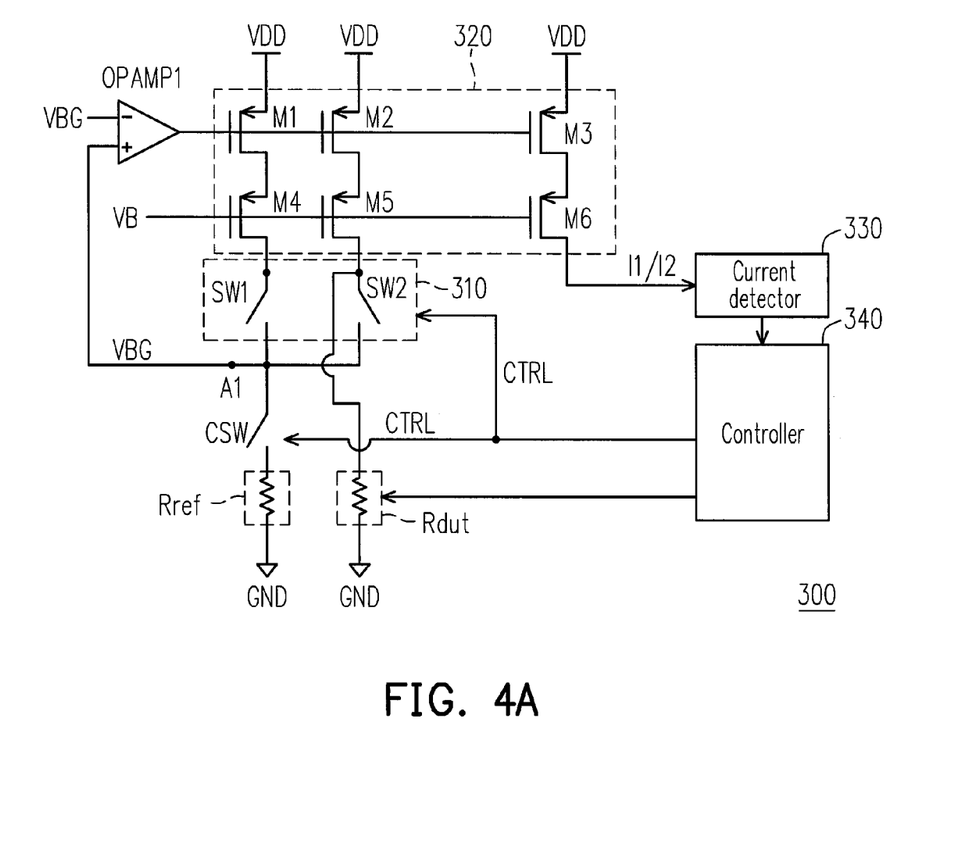
FIG. 4A shows another implementation of the impedance tuning apparatus 300 according to the second embodiment of the present invention.

Referring to FIG. 4A, another implementation of the impedance tuning apparatus 300 according to the second embodiment of the present invention is shown. In the implementation of FIG. 4A, the impedance tuning apparatus 300 further includes a cut-off switch CSW. The cut-off switch CSW is serially connected in a coupling path between the endpoint A1 and the reference resistor Rref. Moreover, the cut-off switch CSW is also controlled by the control signal CTRL, and is synchronously turned on when the switch SW1 in the switching module 310 is turned on.

In addition, another cut-off switch (not shown) also can be inserted between the endpoint A1 and the tuned resistor Rdut, and the cut-off switch is also controlled by the control signal CTRL, and is synchronously turned on when the switch SW2 in the switching module 310 is turned on.

Figure 4B:
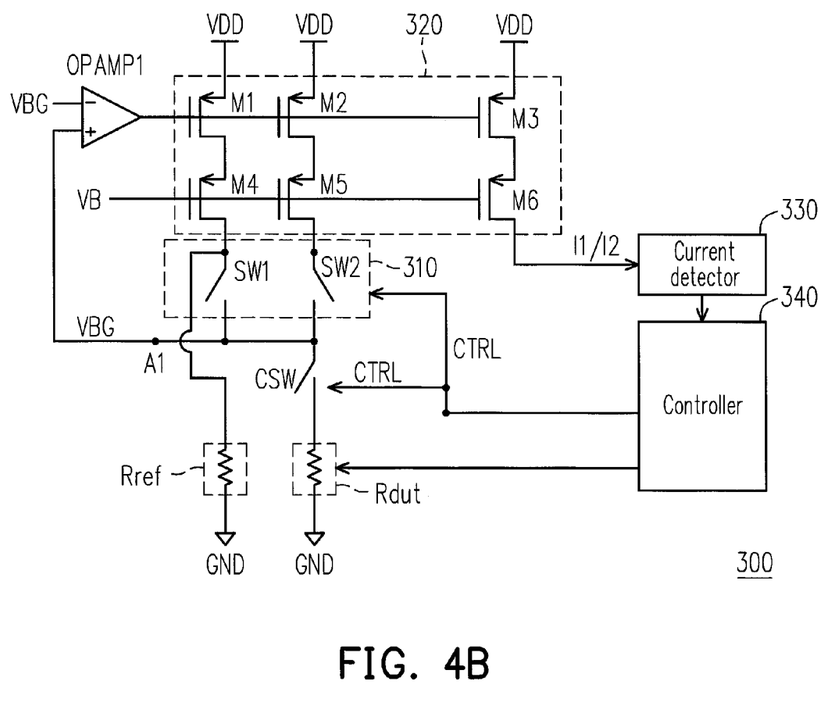
FIG. 4B shows another implementation of the impedance tuning apparatus 300 in FIG. 4A.

Then, referring to FIG. 4B, another implementation of the impedance tuning apparatus 300 in FIG. 4A is shown. As different from the impedance tuning apparatus 300 in FIG. 4A, the switch SW1 is serially connected between the endpoint A1 and the current generator 320, and an endpoint where the switch SW1 is coupled to the current generator 320 is further coupled to an endpoint where the reference resistor Rref is not directly connected to a grounding voltage GND. In addition, the switch SW2 is serially connected between the endpoint A1 and the current generator 320, and the cut-off switch CSW is serially connected between the endpoint A1 and the tuned resistor Rdut. In this implementation, an on or off state of the cut-off switch CSW is the same as that of the switch SW2, and the switches SW1 and SW2 are not turned on at the same time.

Figure 5A:
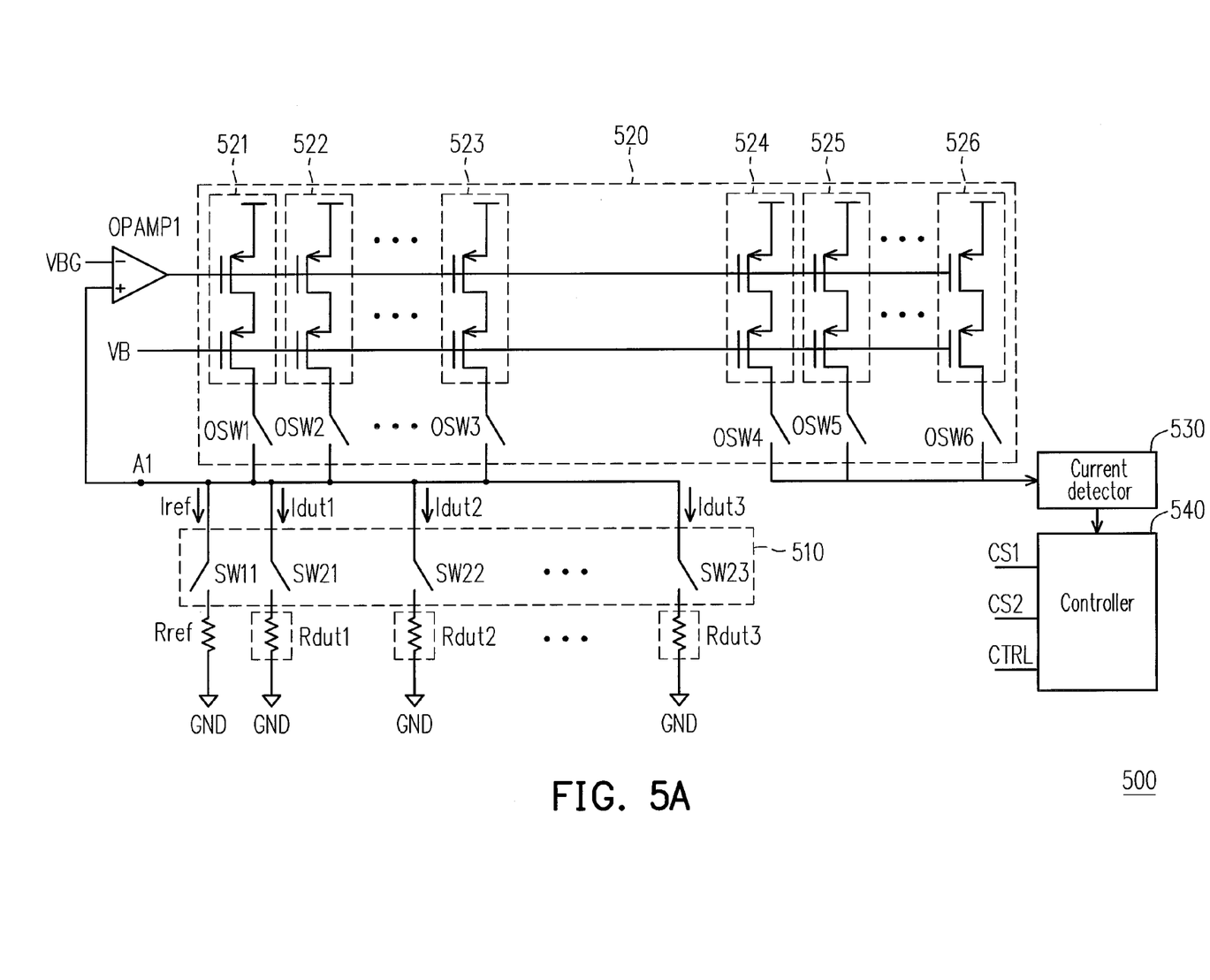
FIG. 5A is a schematic view of an impedance tuning apparatus 500 according to a third embodiment of the present invention.

Referring to FIG. 5A, a schematic view of an impedance tuning apparatus 500 according to a third embodiment of the present invention is shown. The impedance tuning apparatus 500 includes an operation amplifier OPAMP1, a reference resistor Rref, tuned resistors Rdut1-RdutN, a switching module 510, a current generator 520, a current detector 530, and a controller 540. As different from the first and the second embodiments described above, a plurality of tuned resistors Rdut1-RdutN may be tuned in this embodiment. The current generator 520 in this embodiment includes a plurality of current receiving channels 521-523, a plurality of current output channels 524-526, a plurality of receiving terminal switches OSW1-OSW3, and a plurality of output terminal switches OSW4-OSW6.

The current receiving channels 521-523 are connected in parallel with each other, and are used to receive a tuned current Idut or a reference current Iref. The current output channels 524-526 are also connected in parallel with each other, and are used to mirror the tuned currents Idut1-Idut3 or the reference current Iref received by the current receiving channels 521-523 to generate a second current I2 or a first current I1.

The receiving terminal switches OSW1-OSW3 are serially connected in paths where the current receiving channels 521-523 receive the tuned currents Idut1-Idut3 or the reference current Iref. The receiving terminal switches OSW1-OSW3 are controlled by a switching signal CS1 generated by the controller 540 to be turned on or off.

The output terminal switches OSW4-OSW6 are serially connected in paths where the current output channels 524-526 transmit the first current I1 or the second current I2, so as to receive a switching signal CS2, and turn on or off the paths where the current output channels 524-526 transmit the first current I1 or the second current. I2 according to the switching signal CS2.

It should be noted that, the number of the current receiving channels that receive the tuned currents Idut1-Idut3 or the reference current Iref is dependent upon the number of the receiving terminal switches OSW1-OSW3 which are turned on or off, and the number of the current output channels that transmit the first current I1 or the second current I2 is dependent upon the number of the output terminal switches OSW4-OSW6 which are turned on or off. The reference current Iref or the tuned currents Idut1-Idut3 provided by the current generator 520 can be determined by changing a ratio of the number of the current receiving channels that receive the tuned currents Idut1-Idut3 or the reference current Iref to the number of the current output channels that transmit the first current I1 or the second current I2, so as to generate a mirror ratio of the first current I1 or the second current I2 respectively.

In this embodiment, the switching module 510 includes a plurality of switches SW11 and SW21-SW23. The switch SW11 is serially connected between an endpoint A1 and the reference resistor Rref, and the switches SW21-SW23 are respectively serially connected between the endpoint A1 and the tuned resistors Rdut1-Rdut3. The switches SW11 and SW21-SW23 are controlled by a control signal CTRL generated by the controller 540, and only one of the switches SW11 and SW21-SW23 is turned on at a time.

Figure 5B:
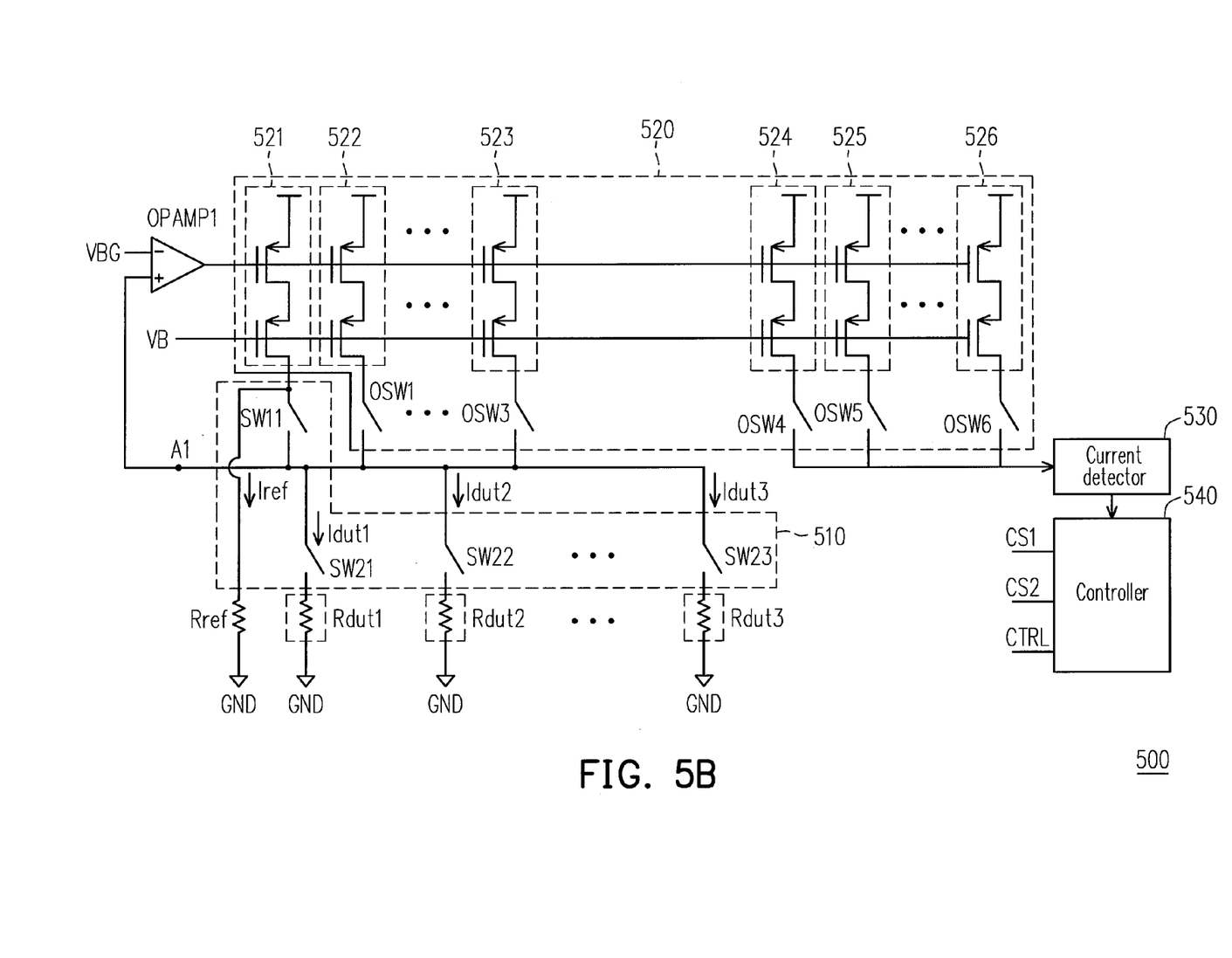
FIG. 5B shows another implementation of the impedance tuning apparatus 500 in FIG. 5A.

Referring to FIG. 5B, another implementation of the impedance tuning apparatus 500 in FIG. 5A is shown. In the implementation of FIG. 5B, the switch SW11 is serially connected between the endpoint A1 and the current generator 520, and an endpoint where the switch SW11 is connected to the current generator 520 is further connected to an endpoint where the reference resistor Rref is not directly connected to a grounding voltage GND. In this way, when it is necessary to measure the reference current Iref flowing through the reference resistor Rref, a voltage on the endpoint A1 may be provided to the reference resistor Rref only by turning on the switch SW11, and thus the reference current Iref is generated.

Figure 6:
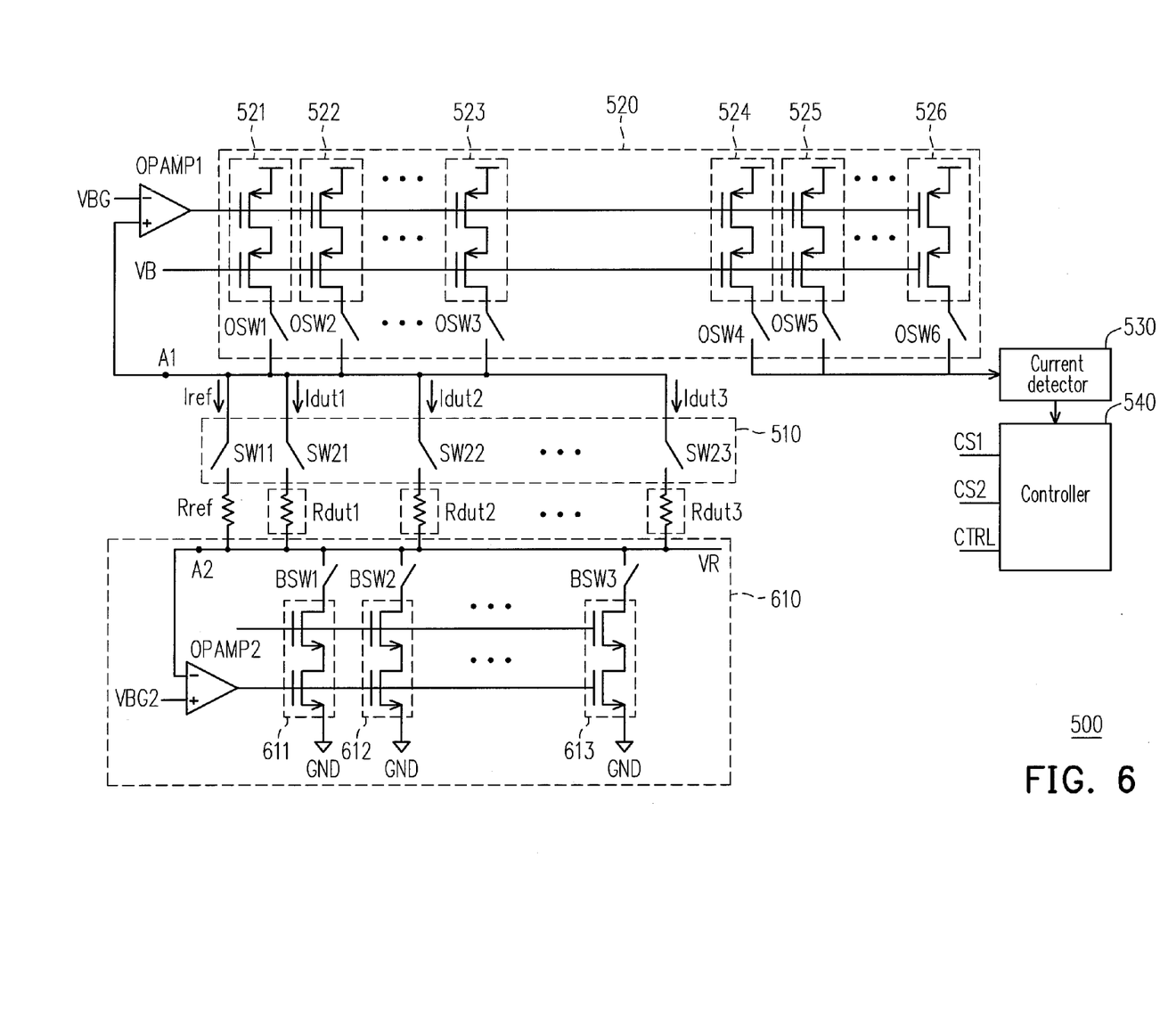
FIG. 6 shows another implementation of the impedance tuning apparatus 500 according to the third embodiment of the present invention.

Then, referring to FIG. 6, another implementation of the impedance tuning apparatus 500 according to the third embodiment of the present invention is shown. In the implementation of FIG. 6, the reference resistor Rref and the tuned resistors Rdut1-Rdut3 are coupled to a reference voltage VR provided by a reference voltage provider 610 instead of being coupled to the grounding voltage GND. The reference voltage provider 610 includes an operation amplifier OPAMP2, switches BSW1-BSW3, and current channels 611-613. The operation amplifier OPAMP2 has a first input terminal, a second input terminal, and an output terminal. The first input terminal receives a reference voltage VBG2, and the second input terminal is coupled to an endpoint A2, in which voltage values of the reference voltage VR and the reference voltage VBG2 are equal. The switches BSW1-BSW3 are respectively coupled between the endpoint A2 and the current channels 611-613, and receive the control signal CTRL generated by the controller 540, so as to be turned on or off. The current channels 611-613 are respectively coupled between the switches BSW1-BSW3 and the grounding voltage GND.

Figure 7:
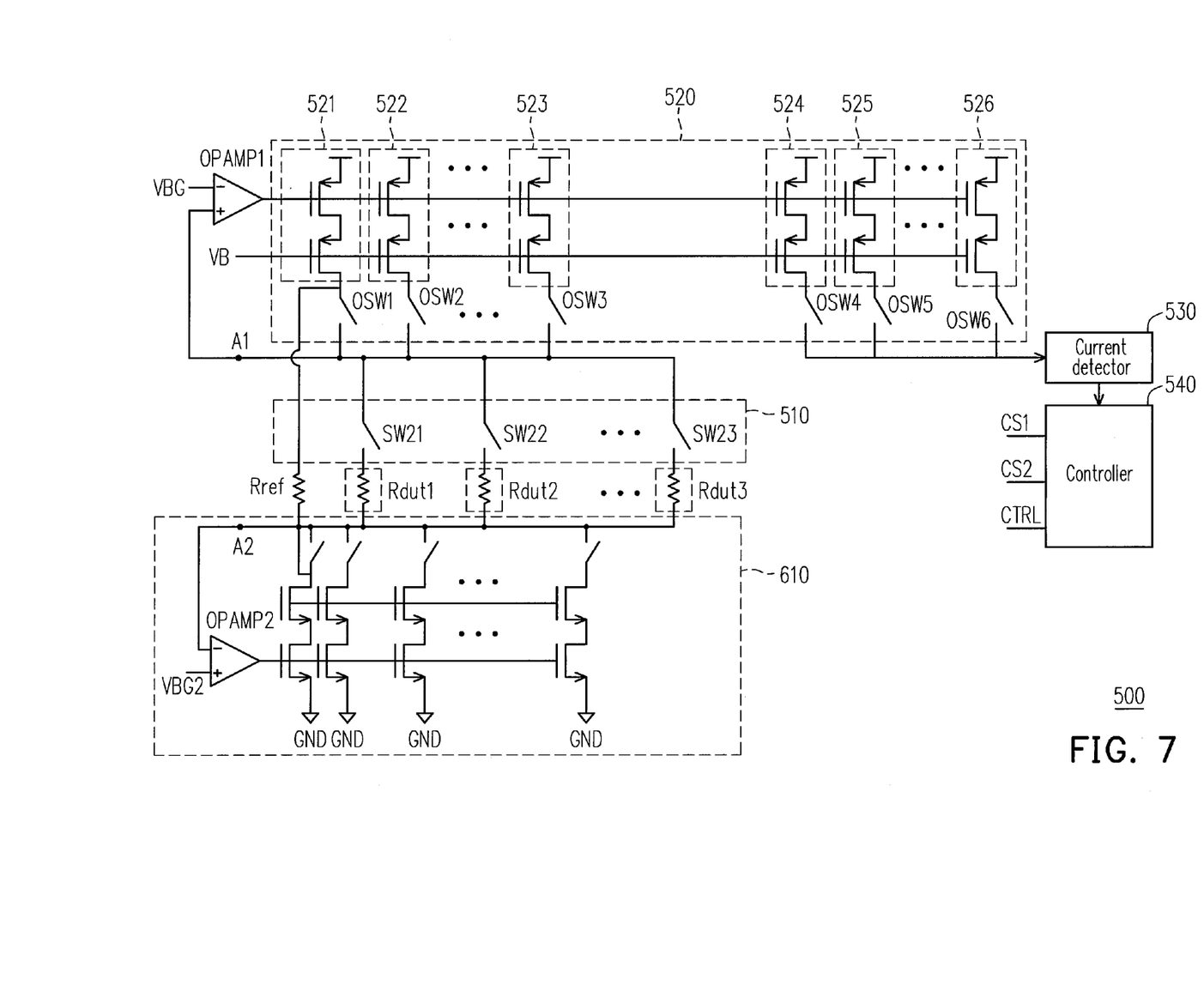
FIG. 7 shows another implementation of the impedance tuning apparatus 500 according to the third embodiment of the present invention.

Finally, referring to FIG. 7, another implementation of the impedance tuning apparatus 500 according to the third embodiment of the present invention is shown. In the switching module 510 of the impedance tuning apparatus 500, the switches that are originally serially connected between the reference resistor Rref and the current generator 520 are integrated into the receiving terminal switch OSW1 in the current generator 520. That is to say, in this embodiment, the receiving terminal switch OSW1 not only turns on or off the path where the current receiving channel 521 receives the reference current Iref, but also couples the endpoint A1 to the reference resistor Rref. Definitely, at this time, the reference resistor Rref has to be connected between a common coupling terminal of the current receiving channel 521 and the receiving terminal switch OSW1 and the endpoint A2.

Based on the above, in the impedance tuning apparatus of the present invention, the reference current and the tuned current are generated respectively by using the voltage provided by the endpoint connected to the second input terminal of the operation amplifier through the reference resistor or the tuned resistor. Therefore, the reference current and the tuned current are only related to the voltage on the endpoint, and an input voltage offset of the operation amplifier does not affect accurate values of the reference current and the tuned current. In addition, in the present invention, it is unnecessary to tune or calculate the impedance through resistance voltage division, and thus the impedance tuning apparatus of the present invention can provide a more accurate impedance tuning action.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An impedance tuning apparatus, comprising:
   an operation amplifier, having a first input terminal, a second input terminal, and an output terminal, wherein the first input terminal receives a basic voltage, and the second input terminal is coupled to a first endpoint;
   a reference resistor, wherein a terminal of the reference resistor is coupled to a reference voltage;
   a tuned resistor, wherein a terminal of the tuned resistor is coupled to the reference voltage;
   a switching module, for receiving a control signal, and coupling the first endpoint to the other terminal of the tuned resistor or the reference resistor according to the control signal for generating a tuned current or a reference current respectively;
   a current generator, coupled to the switching module, for receiving and mirroring the reference current or the tuned current to generate a first current or a second current respectively;
   a current detector, for receiving the first current and the second current, and outputting current values of the first and the second currents; and
   a controller, coupled to the current detector and the tuned resistor, for receiving the current values of the first and the second currents, and tuning a resistance value of the tuned resistor according to the current values of the first and the second currents.

2. The impedance tuning apparatus according to claim 1, wherein the current generator comprises:
   a current receiving channel, for receiving the tuned current or the reference current; and a current output channel, coupled to the current receiving channel, for mirroring the reference current or the tuned current to generate the first current or the second current respectively.

3. The impedance tuning apparatus according to claim 2, wherein the current receiving channel comprises:
a first transistor, a first terminal of the first transistor receives an operating voltage, and a control terminal of the first transistor is coupled to the output terminal of the operation amplifier; and
a second transistor, a first terminal of the second transistor is coupled to a second terminal of the first transistor, a control terminal of the second transistor is coupled to a bias voltage, and a second terminal of the second transistor receives the tuned current or the reference current.

4. The impedance tuning apparatus according to claim 3, wherein the current output channel comprises:
a third transistor, a first terminal of the third transistor receives the operating voltage, and a control terminal of the third transistor is coupled to the output terminal of the operation amplifier; and
a fourth transistor, a first terminal of the fourth transistor is coupled to a second terminal of the third transistor, a control terminal of the fourth transistor is coupled to the bias voltage, and a second terminal of the fourth transistor generates the first or the second current.

5. The impedance tuning apparatus according to claim 4, wherein the switching module comprises:
a first switch, serially connected between the first endpoint and the reference resistor; and
a second switch, serially connected between the first endpoint and the tuned resistor,
wherein the first and the second switches are controlled by the control signal, and are not turned on at the same time.

6. The impedance tuning apparatus according to claim 1, wherein the current generator comprises:
a first current receiving channel, for receiving the reference current;
a second current receiving channel, for receiving the tuned current; and
a current output channel, coupled to the first and the second current receiving channels, for mirroring the tuned current or the reference current to generate the first or the second current respectively,
wherein the first and the second current receiving channels do not receive the reference current and the tuned current at the same time.

7. The impedance tuning apparatus according to claim 1, wherein the first current receiving channel comprises:
a first transistor, a first terminal of the first transistor receives an operating voltage, and a control terminal of the first transistor is coupled to the output terminal of the operation amplifier; and
a second transistor, a first terminal of the second transistor is coupled to a second terminal of the first transistor, a control terminal of the second transistor is coupled to a bias voltage, and a second terminal of the second transistor is coupled to the switching module and the reference resistor.

8. The impedance tuning apparatus according to claim 7, wherein the second current receiving channel comprises:
a third transistor, a first terminal of the third transistor receives the operating voltage, and a control terminal of the third transistor is coupled to the output terminal of the operation amplifier; and
a fourth transistor, a first terminal of the fourth transistor is coupled to a second terminal of the third transistor, a control terminal of the fourth transistor is coupled to the bias voltage, and a second terminal of the fourth transistor is coupled to the switching module and the tuned resistor.

9. The impedance tuning apparatus according to claim 8, wherein the current output channel comprises:
a fifth transistor, a first terminal of the fifth transistor receives the operating voltage, and a control terminal of the fifth transistor is coupled to the output terminal of the operation amplifier; and
a sixth transistor, a first terminal of the sixth transistor is coupled to a second terminal of the fifth transistor, a control terminal of the sixth transistor is coupled to the bias voltage, and a second terminal of the sixth transistor generates the first or the second current.

10. The impedance tuning apparatus according to claim 8, wherein the switching module comprises:
a first switch, serially connected between the first endpoint and the second terminal of the second transistor; and
a second switch, serially connected between the first endpoint and the second terminal of the fourth transistor,
wherein the first and the second switches are controlled by the control signal, and are not turned on at the same time.

11. The impedance tuning apparatus according to claim 8, further comprising:
a first cut-off switch, serially connected in a coupling path between the first endpoint and the reference resistor.

12. The impedance tuning apparatus according to claim 8, further comprising:
a second cut-off switch, serially connected in a coupling path between the first endpoint and the tuned resistor.

13. An impedance tuning apparatus, comprising:
an operation amplifier, provided with a first input terminal, a second input terminal, and an output terminal, wherein the first input terminal receives a basic voltage, and the second input terminal is coupled to a first endpoint;
a reference resistor, wherein a terminal of the reference resistor is coupled to a reference voltage;
a plurality of tuned resistors, wherein a terminal of each of the tuned resistors is commonly coupled to the reference voltage;
a switching module, for receiving a control signal, and coupling the first endpoint to the other terminal of one of the tuned resistors or the other terminal of the reference resistor according to the control signal for generating a tuned current or a reference current respectively;
a current generator, coupled to the switching module, for receiving and mirroring the tuned current or the reference current to generate a first current or a second current respectively;
a current detector, for receiving the first current and the second current, and outputting current values of the first and the second currents; and
a controller, coupled to the current detector and the tuned resistor, for receiving the current values of the first and the second currents, and tuning a resistance value of the tuned resistors according to the current values of the first and the second currents.

14. The impedance tuning apparatus according to claim 13, wherein the current generator comprises:
a plurality of current receiving channels, connected in parallel with each other, for receiving the tuned current or the reference current;
a plurality of current output channels, connected in parallel with each other, for mirroring the tuned current or the reference current to generate the second current or the first current;

a plurality of receiving terminal switches, serially connected in paths where the current receiving channels receive the tuned current or the reference current, for receiving a first switching signal, and turning on or off the paths where the current receiving channels receive the tuned current or the reference current according to the first switching signal; and a plurality of output terminal switches, serially connected in paths where the current output channels transmit the first current or the second current, for receiving a second switching signal, and turning on or off the paths where the current output channels transmit the first current or the second current according to the second switching signal.

15. The impedance tuning apparatus according to claim 13, further comprising:

a reference voltage provider, coupled to the tuned resistors and the reference resistor, for providing the reference voltage.

16. The impedance tuning apparatus according to claim 15, wherein the reference voltage provider comprises:

an operation amplifier, provided with a first input terminal, a second input terminal, and an output terminal, wherein the first input terminal receives the reference voltage, and the second input terminal is coupled to a second endpoint;

a plurality of switches, coupled to the second endpoint, for receiving the control signal, and being turned on or off according to the control signal; and a plurality of current channels, respectively coupled between the switches and a grounding voltage.

\* \* \* \* \*